United States Patent

Kurita

[11] Patent Number: 5,175,538
[45] Date of Patent: Dec. 29, 1992

[54] REMOTE CONTROL

[75] Inventor: Tohru Kurita, Tokyo, Japan

[73] Assignee: Sony Corporation, Tokyo, Japan

[21] Appl. No.: 233,657

[22] PCT Filed: Nov. 11, 1987

[86] PCT No.: PCT/JP87/00873
§ 371 Date: Jul. 11, 1988
§ 102(e) Date: Jul. 11, 1988

[87] PCT Pub. No.: WO88/03736
PCT Pub. Date: May 19, 1988

[30] Foreign Application Priority Data

Nov. 12, 1986 [JP] Japan .................. 61-269400

[51] Int. Cl.$^5$ ............................................. G08C 19/00
[52] U.S. Cl. ........................... 340/825.69; 340/825.72
[58] Field of Search ................... 340/825.69, 825.72,
340/825.56, 825.37, 712, 825.31; 341/23, 33,
176; 358/194.1; 455/603, 353

[56] References Cited

U.S. PATENT DOCUMENTS

| | | | |
|---|---|---|---|
| 4,626,848 | 12/1986 | Ehlers | 358/194.1 |
| 4,703,359 | 10/1987 | Rumbolt et al. | 358/194.1 |
| 4,712,105 | 12/1987 | Kohler | 340/825.72 |
| 4,728,949 | 3/1988 | Platte et al. | 340/825.37 |
| 4,746,919 | 5/1988 | Reitmeier | 340/825.69 |
| 4,769,643 | 9/1988 | Sogame | 340/825.69 |
| 4,771,283 | 9/1988 | Imoto | 340/825.72 |
| 4,825,200 | 4/1989 | Evans et al. | 455/353 |
| 4,825,209 | 4/1989 | Sasaki et al. | 340/825.72 |

FOREIGN PATENT DOCUMENTS 61-111089 5/1986 Japan .
61-201571 9/1986 Japan .

OTHER PUBLICATIONS

Hiroshi Koinuma, "What is a Learning Remote Control", Mar. 1988, Electronics.

Primary Examiner—Donald J. Yusko
Assistant Examiner—Michael Horabik
Attorney, Agent, or Firm—Hill, Van Santen, Steadman & Simpson

[57] ABSTRACT

There is provided a remote commander, or remote control of a remotely-controlled apparatus in which transmission data of another remote commander (2) is stored in a memory of the remote commander that belongs to a main body and the thus stored transmission data is transmitted again. In this remote commander, transmission data of the other remote commander (2) is stored in a RAM (1) as user remote control data, transmission data of the remote commander that belongs to the main body is stored in a ROM (3) as original remote control data and the original remote control data and the user remote control data are selected by switching means (4). Thus, the remote commander becomes more useful.

2 Claims, 4 Drawing Sheets

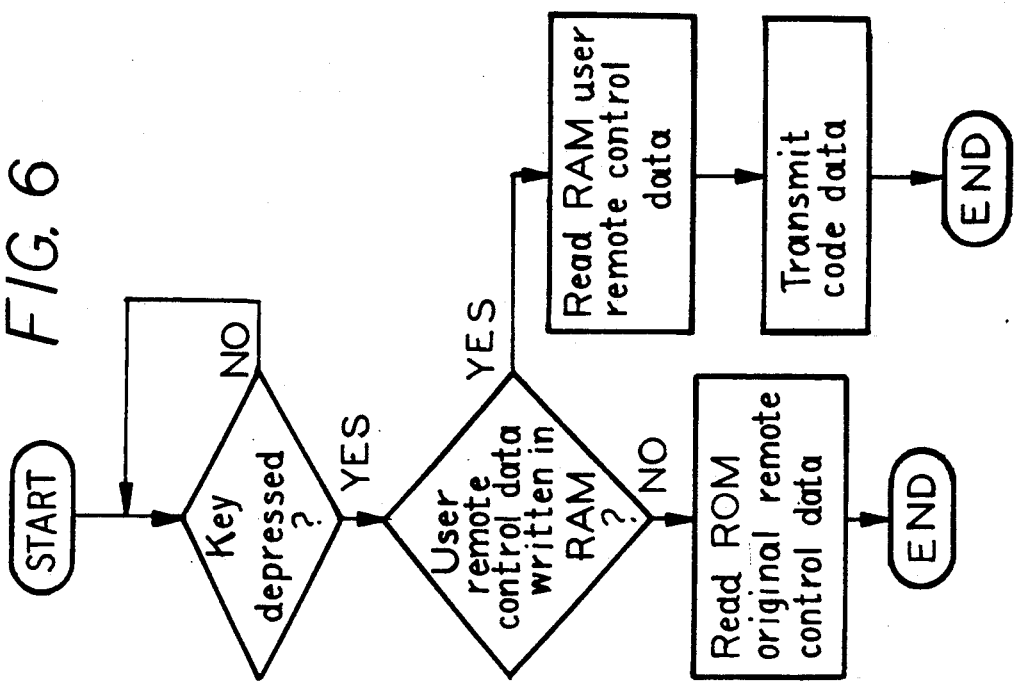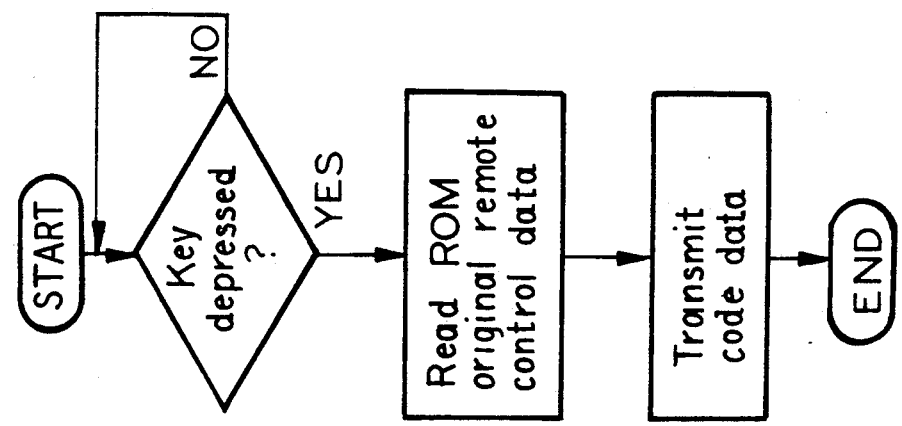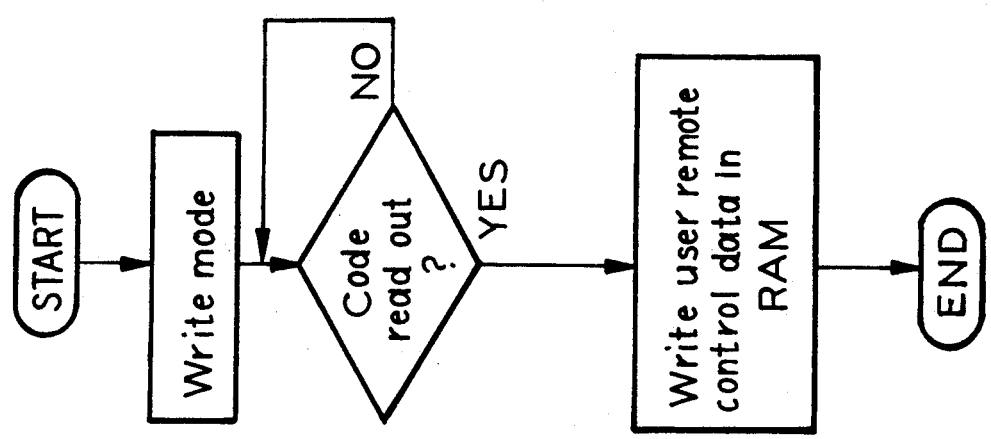

REMOTE CONTROL

DESCRIPTION

1. Technical Field

The present invention relates to a remote commander or remote control of a remotely-controlled apparatus and particularly to a remote commander of a remotely-controlled apparatus in which data transmitted from other remote commander or remote control is stored in a memory of a remote commander that belongs to a main body and the thus stored transmitted data is transmitted again.

2. Background Art

When in general a so-called AV system is assembled by combining a television receiver made by a company S, a video tape recorder made by another company, for example, company V and audio equipment made by, for example, company M, the respective apparatus are independently operated by remote commanders of the remotely-controlled apparatus that belong to the respective apparatus, which is inconvenient in use. To remove this disadvantage, Japanese laid-open patent gazette No. 60-254878 proposed such a remote commander that can store data transmitted from another remote commander and which can transmit the thus stored transmitted data again. In FIG. 1, reference numeral 1 designates a previously-proposed remote commander capable of re-transmitting the thus transmitted data and 2 a remote commander of a remotely-controlled apparatus that belongs to the television receiver made by, for example, the company S, a remote commander of a remotely-controlled apparatus that belongs to the video tape recorder made by the company V or a remote commander of a remotely-controlled apparatus that belongs to the audio equipment made by the company M. In this remote commander 2, command operations are determined by a plurality of operation keys 2a, 2b . . . as is well-known. Also, predetermined transmitting data are transmitted by operating the respective operation keys 2a, 2b . . . The remote commander 1 is arranged to switch its memory mode and transmission mode. In the memory mode of this remote commander 1, as shown in FIG. 1, a transmitting section of another remote commander 2 is located in correspondence with a receiving section of this remote commander 1, whereby when the operation key 2a of the operations keys 2a, 2b . . . is corresponded with, for example, the key 1a of the desired keys 1a, 1b . . . and they are operated together, data transmitted by operating, for example, the operation key 2a of other the remote commander 2 is stored in the remote commander 1 at its memory section corresponding, for example, to the operation key 1a. In the transmission mode of this remote commander 1 when the operation keys 1a, 1b . . . are operated, the transmitted data stored in correspondence therewith are transmitted. Accordingly, in such a remote commander 1, when data transmitted in correspondence with the respective operating keys of the remote commander that belongs to the television receiver made by the company S, data transmitted in correspondence with the respective operating keys of the remote commander that belongs to the video tape recorder made by the company V and data transmitted in correspondence with the respective operating keys of the remote commander that belongs to the audio equipment made by the company M are stored in response to the respective operation keys 1a, 1b . . . , the above-mentioned AV system can be operated by the single remote commander 1, which is convenient.

In such a remote commander 1, however, when the operation key corresponding to the memory section in which data transmitted from the other remote commander is not previously stored is operated, the above-mentioned key operation is treated as a transmission error in the remotely-controlled apparatus.

DISCLOSURE OF INVENTION

In view of such an aspect, the present invention is intended to provide the remote commander 1 which can remove the above-mentioned disadvantages and which can be used more conveniently.

The present invention relates to a remote commander or remote control in which data transmitted from another remote commander is stored as user remote control data and the thus stored user remote control data can be transmitted again. This remote commander includes a ROM in which original remote control data is stored.

According to the present invention, the above-mentioned remote commander is provided with a change over switch by which the user remote control data and the original remote control data can be selectivly used.

Further, according to the present invention, the switched condition of the above-mentiond change-over switch is displayed.

Furthermore, according to the present invention, when the user remote control data is used, if the operation key corresponding to the memory section in which no data transmitted from the other remote commander is stored is operated, the original stored remote control data is transmitted in response to this key operation.

Thus, according to the present invention, since the remote commander includes the ROM in which the original remote control data is stored, when the equipment, which can be controlled by this original remote control data, is used, it is not necessary to store the transmitting data in response to the operation key in advance. Since the user remote control data and the original remote control data can be selectively used, the remote commander of the invention can be applied to a wide variety of equipment.

In addition, when the user remote control data is used, if the operation key in which no data transmitted from the other remote commander is stored is operated, the stored original remote control data is transmitted in response to this operation key. Thus, at that time, it is not necessary to store in advance data of the equipment which can be controlled by the original remote control data. Further, when a wrong key is operated inadvertently, this key operation is not treated as a transmission error.

BRIEF DESCRIPTION OF DRAWINGS

FIG. 2 is a block diagram of an embodiment of a remote commander according to the present invention and FIGS. 3, 4, 5 and 6 are representations used to explain the present invention, respectively.

BEST MODE FOR CARRYING OUT THE INVENTION

An embodiment of a remote commander or remote control according to the present invention will hereinafter be described with reference to the drawings.

Figure 1:
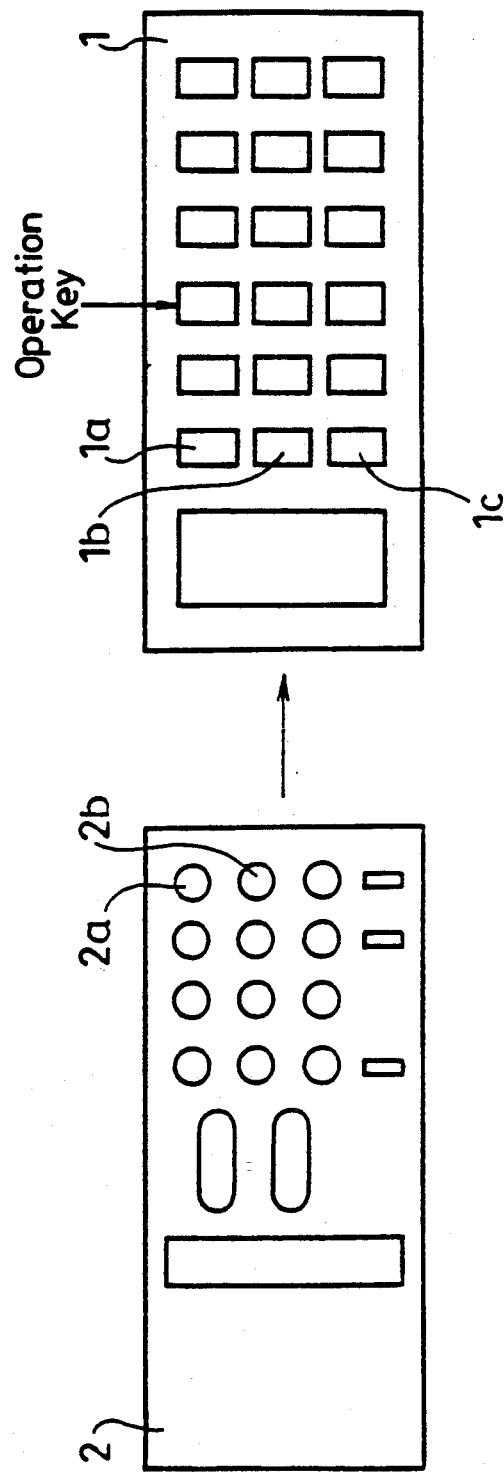
FIG. 1 is a construction diagram showing of an embodiment of a conventional remote commander.
Figure 2:
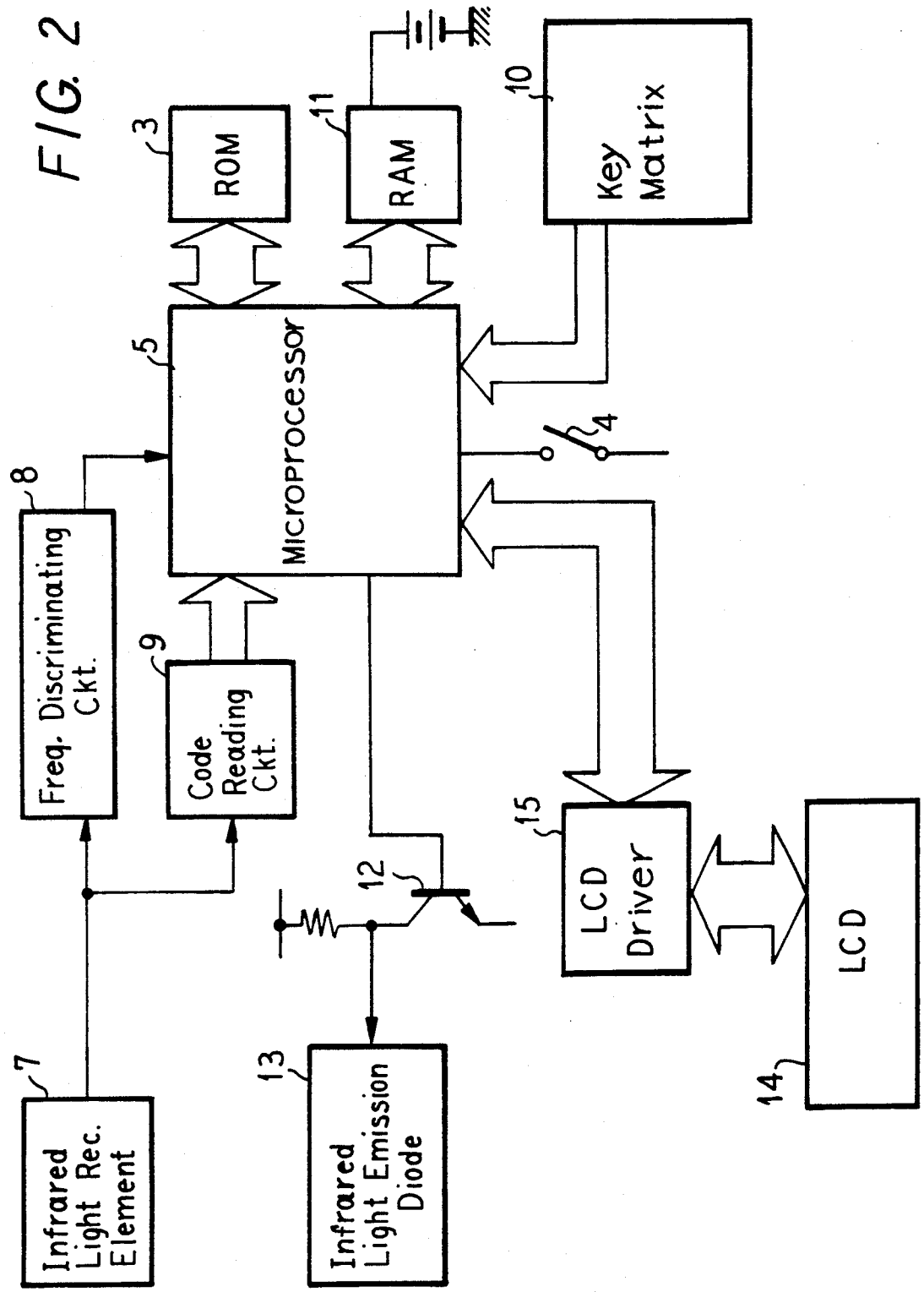
Figure 3:
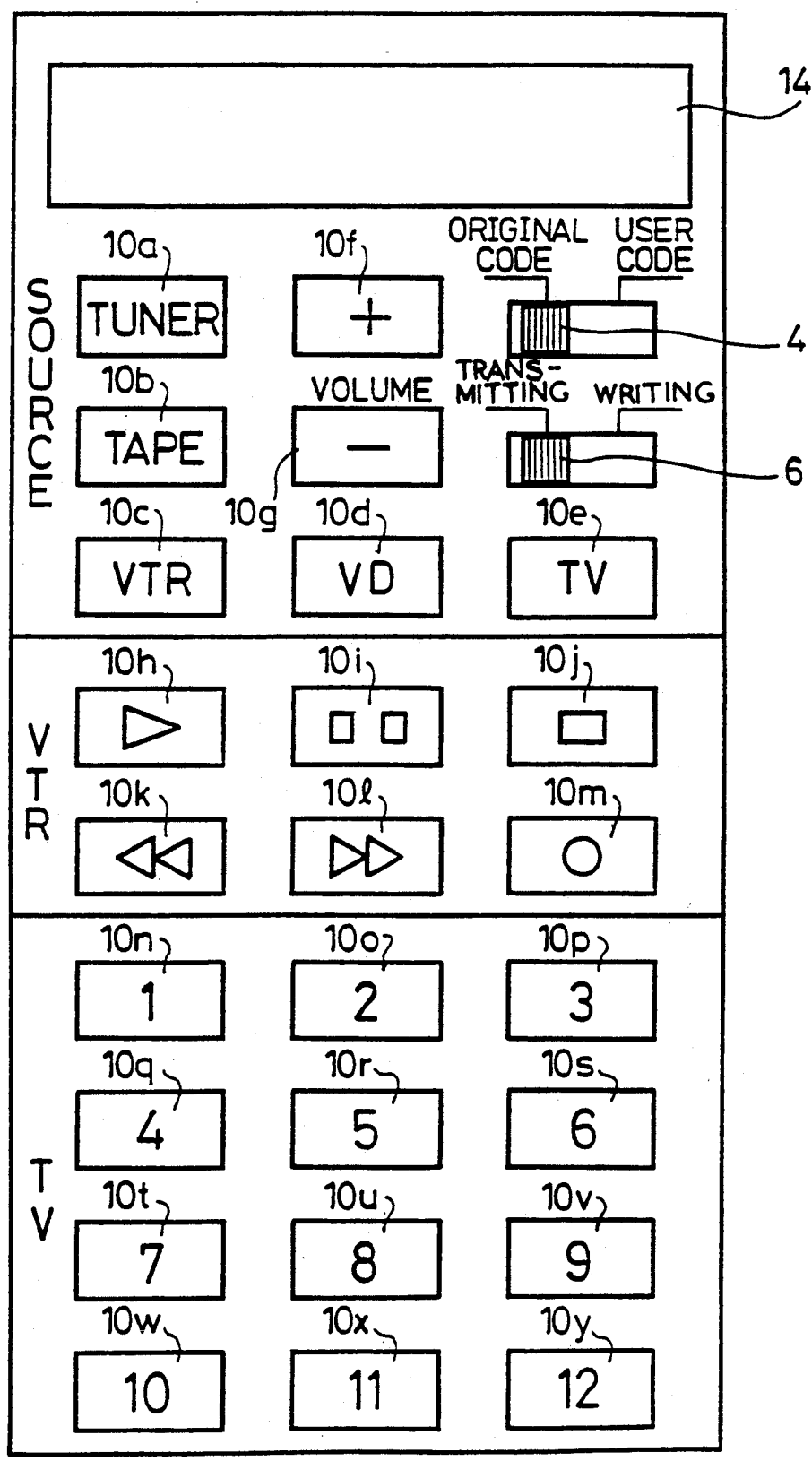

This embodiment provides a remote commander of a remotely-controlled apparatus utilizing infrared rays and which is formed to be capable of transmitting the transmitted data again by a microprocessor 5. FIG. 3 illustrates a plan view of the remote commander according to this embodiment. In FIG. 3, reference numeral 6 denotes a transmission-writing change-over switch by which the remote commander is switched to the transmission mode or the writing mode. When the transmission-writing change-over switch 6 is switched to the writing position, the remote commander of the invention is constructed the same as that shown in FIG. 1. Namely, at that time, as shown in FIG. 1, FSK data, for example, transmitted from another remote commander 2 is received by an infrared light receiving element 7. The transmitted data developed at the output side of the light receiving element 7 is supplied to a frequency discriminating circuit 8, which discriminates the transmission frequency of the thus transmitted data, and also fed to a code reading circuit 9 which detects the peak level and reads the code of the transmitted data. The identifying data from the frequency discriminating circuit 8 and code data developed at the output side of the code reading circuit 9 are supplied through the microprocessor 5 and then written in a random access memory (hereinafter referred to as a RAM) 11 at its address corresponding to an operation key selected from operation keys 10a, 10b . . . 10Y forming a key matrix 10, for example, an operation key 10i as user remote control data. This writing operation is executed if necessary.

In this embodiment, in addition to the RAM 11, there is provided a read only memory (hereinafter referred to as a ROM) 3 in which original remote control data were already written in response to the operation commanding operation keys 10a, 10b, . . . 10Y forming the key matrix 10. The original remote control data are specified remote control data such as data transmitted from the remotely-controlled apparatus that belong to the television receiver, the video tape recorder, the audio equipment and so on made by the company S when this remote commander, for example, is manufactured by the company S. Further, in this embodiment, there is provided an original code—user code change-over switch 4 which switches the original remote control data transmission mode and the user remote control data transmission mode. When the original control data or the user remote control data is transmitted, for example, FSK original remote control data or user remote control data obtained from the microprocessor 5 are supplied through a driver circuit 12 to an infrared light emission diode 13. This infrared light emission diode 13 transmits infrared remote control signals to respective equipment. Reference numeral 14 designates a liquid crystal display panel. In this embodiment, the display signal from the microprocessor 5 is supplied through a liquid crystal driver circuit 15 to this liquid crystal display panel 14 which displays the contents of various commands and which displays the switched condition of the original code—user code change-over switch 4, thus informing of the operator whether the original remote control data is transmitted or the user remote control data is transmitted in a liquid crystal display fashion.

In the thus arranged remote commander, upon writing, as shown in FIG. 1, the other remote commander 2 is located in an opposing relation to the remote commander of this embodiment. Then, the transmitting-writing change-over switch 6 shown in FIG. 3 is switched to the writing position and thereafter, any one of the operation keys 2a, 2b . . . of the other remote commander 2 for the transmitted data to be written is operated. Also, one operation key 10i of the corresponding operation keys 10a, 10b . . . 10Y in this embodiment is operated, whereby it is decided by the microprocessor 5 whether or not the code is read out on the basis of the signals from the frequency discriminating circuit 8 and the code reading circuit 9. If the code is read out, this code is written in the RAM 11 at its address specified by the thus selected operation key 10i. This operation is repeatedly executed at necessary times.

When the remote commander of this embodiment is utilized as a commander, the transmitting-writing change-over switch 6 is connected to the transmitting position. In this case, when the equipment to be remotely-controlled, for example, the television receiver, the video tape recorder, the audio equipment and so on are all made by, for example, the company S and which can be controlled by the original remote control data, the original code—user code change-over switch 4 is switched to the original code position. At that time, as shown in FIG. 5, it is decided whether the operation keys 10a, 10b . . . 10y are operated or not. If they are operated, the original remote control data is read out from the ROM 3 at its address corresponding to, for example, the operation key 10i operated. Then, this original remote control data is transmitted from the infrared light emission diode 13 to control the predetermined equipment.

When the original code—user code change-over switch 4 is switched to the user code position and the user remote control data previously written in the RAM 11 is transmitted again, the remote commander of the invention is operated as shown in FIG. 6. At that time, it is decided by the microprocessor 5 whether the operation keys 10a, 10b . . . 10y are operated or not. If the operation key 10i, for example, is operated, it is decided whether the user remote control data is written in the RAM 11 at its address corresponding to the operation key 10i. If it is written therein, the user remote control data written in this RAM at its address corresponding to the operation key 10i is transmitted to control the predetermined equipment. Also, at that time, if the user remote control data is not written in the RAM 11 at its address corresponding to the operation key 10i, the original remote control data is read out from the ROM 3 at its address corresponding to this operation key 10i and this original remote control data is transmitted.

Since the remote commander of this embodiment is constructed as described above, the transmission data corresponding to each operation key of the remote commander of the television receiver made by, for example, the company S, the transmission data corresponding to each operation key of the remote commander of the video tape recorder made by the company V and the transmission data corresponding to each key of the remote commander of the audio equipment made by the company M can be written in response to the respective operation keys 10a, 10b... 10y. Thus, it is convenient that the AV system arranged by combining the equipment made by the plurality of makers can be operated by the single remote commander.

In the foregoing, when the original remote control data of the company S is written in the ROM 3, it is not necessary to write transmission data of each operation key of the remote commander that belongs to the television receiver made by the company S. In this case, even when the original code—user code change-over switch 4 is connected to the user code position, the transmission data is not written in the RAM 11 in response to each operation key of the remote commander that belongs to the television receiver so that as shown in FIG. 6, this original remote control data is read out from the ROM 3, thus controlling the operation of this television receiver satisfactorily. In other words, when the equipment, which can be controlled by the original remote control data stored in the ROM 3, is used, the transmission data does not have to be written in advance in response to the key operation. This makes the remote commander of the invention more useful. The original remote control data and the user remote control data can be selectively used by changing the original code—user code change-over switch 4. For example, in addition to one set of the AV system made by, for example, the company S, a television receiver, a video tape recorder, an audio equipment or the like made by a company different from the company S can be remotely-controlled. Thus, it is convenient that the kinds of remotely-controllable equipment are increased. Further, since the liquid crystal display panel 14 displays the switched condition of the original code—user code change-over switch 4, the user can recognize the switched condition at first sight. Furthermore, when the user remote control data is used, if the operation key relating to the memory section in which the corresponding transmission data of the other remote commander 2 is not stored is operated, the previously-stored original remote control data in response to the operation key is transmitted. Thus, even when the wrong key is operated inadvertently, transmission error can be avoided.

The present invention is not limited to the above-mentioned embodiment but it can take various modifications without departing from the gist of the invention.

According to the present invention, since the transmission data corresponding to the respective operation keys of the respective remote commanders made by the plurality of makers can be written in response to the respective operation keys 10a, 10b... 10y and they can be transmitted again, it is convenient that the equipment made by the plurality of makers can be operated by the single remote commander. Further, there is provided the ROM 3 in which particular original remote control data is stored so that when the equipment which can be controlled by the original remote control data stored in this ROM 3 is used, the transmission data does not have to be written in advance in response to the operation key. Thus, the remote commander of the invention becomes more useful. By switching the original code—user code change-over switch 4, it is possible to select the original remote control data and the user remote control data, that is, to remotely-control the television receiver, the video tape recorder, the audio equipment or the like made by the different company in addition to one set of the AV system made by the particular company. Thus, it becomes more useful that the kinds of the remotely-controllable equipment are increased. Further, since the liquid crystal display panel 14 displays the switched condition of the original code—user code change-over switch 4, it is useful that the user can recognize the switched condition at first sight. Furthermore, when the user remote control data is used, even if the operation key relating to the memory section in which the corresponding transmission data of other remote commander 2 is not stored is operated, the previously-stored original remote control data in response to the operation key is transmitted. Thus, even when the wrong operation key is operated unintentionally, the transmission error can be avoided.

Although other modifications and changes may be suggested by those skilled in the art, it is the intention of the inventor to embody within the patent warranted hereon all changes and modifications as reasonably and properly come within the scope of his contribution to the art.

I claim:

1. A remote control in which data transmitted from another remote control are received, said data are stored as user remote control data corresponding to respective operation keys and the thus stored predetermined user remote control data can be transmitted by operating said operation keys, characterized in that said remote control comprises a ROM for storing original remote control data; switching means for selecting and using said user remote control data or said original remote control data; and means for transmitting original remote control data from said ROM in response to operation of a key when no user remote control data corresponding to said key is stored in said remote control.

2. A programmable remote unit for transmitting control codes to remotely control equipment, comprising:
   a key matrix of operating keys;
   code receiving means for receiving user control codes from another remote control;
   programmable memory means for storing said user control codes from said another remote control;
   transmitting means for transmitting said user control codes when corresponding ones of said operating keys are operated;
   permanent memory means for storing predetermined control codes;
   switch means for selectively switching between said user control codes and said predetermined control codes for transmittal by said transmitting means when said operating keys are operated; and
   means for transmitting said predetermined control codes from said transmitting means when an operating key is operated for which no corresponding user control codes are present in said programmable memory means even when said switch means is switched to said user control codes.

* * * * *